(12) United States Patent
Fu et al.

(10) Patent No.: US 8,497,568 B2
(45) Date of Patent: Jul. 30, 2013

(54) MONITORING PATTERN, AND PATTERN STITCH MONITORING METHOD AND WAFER THEREWITH

(75) Inventors: Kuo Kuei Fu, Guishan Township (TW); Yi Nan Chen, Taipei (TW); Hsien Wen Liu, Luzhu Township (TW)

(73) Assignee: Nanya Technology Corporation, Kueishan (TW)

( * ) Notice: Subject to any disclaimer, the term of this patent is extended or adjusted under 35 U.S.C. 154(b) by 218 days.

(21) Appl. No.: 13/079,853

(22) Filed: Apr. 5, 2011

(65) Prior Publication Data

US 2012/0256298 A1    Oct. 11, 2012

(51) Int. Cl.
*H01L 29/06* (2006.01)
(52) U.S. Cl.
USPC .................. 257/618; 257/797; 257/E23.179; 716/51

(58) Field of Classification Search
USPC ...................... 257/618, 797, E23.179; 716/51
See application file for complete search history.

(56) References Cited

U.S. PATENT DOCUMENTS 6,194,105 B1 *    2/2001   Shacham et al. .................. 430/5

* cited by examiner

*Primary Examiner* — Tu-Tu Ho
(74) *Attorney, Agent, or Firm* — Novak Druce Connolly Bove + Quigg LLP

(57) ABSTRACT

A monitoring pattern for pattern stitch in double patterning is provided with a plurality of pattern cuts that include at least one line-ended cut and at least one non-line-ended cut, wherein every pattern cut has a stitching critical dimension (CD). A semiconductor wafer having at least one target pattern corresponding to the monitoring pattern is also provided. A method for monitoring pattern stitch can be preformed to check for pattern cut displacement in stitching areas and to increase reliability and printability of layouts, by comparing corresponding stitching critical dimensions of the target pattern and the monitoring pattern.

13 Claims, 7 Drawing Sheets

US 8,497,568 B2

MONITORING PATTERN, AND PATTERN STITCH MONITORING METHOD AND WAFER THEREWITH

1. TECHNICAL FIELD

The present invention relates to a monitoring pattern, and a pattern stitch monitoring method and a semiconductor wafer therewith, and more particularly, to a monitoring pattern for double patterning, and a pattern stitch monitoring method and a semiconductor wafer therewith.

2. BACKGROUND

With the rapid development of integrated circuit fabrication processes, cells in modern integrated circuits are fabricated in a more compact manner and have smaller pitches, as compared with cells in conventional integrated circuits. For example, pitch requirements for integrated circuit fabrication processes have evolved from micron level to nanometer level. Accordingly, lithography has to be precisely performed in order for layout patterns to be exactly exposed via masks before being mapped to a semiconductor wafer. Current lithography technique faces many unsolved problems. Smaller cell pitches increase the layout pattern distortion due to light diffraction and affect the reliability of the integrated circuit fabrication process.

Double pattern technology is commonly used to apply immerse lithography technology at a nanometer scale. Double pattern technology enables integrated circuit-based layout patterns on a single mask to be decomposed and mapped to two masks. In addition, layout patterns of finer pitches can be obtained using double exposure technology.

Double pattern lithography technology, in which layout patterns on a single mask are decomposed and mapped to two masks, can reduce layout pattern pitches; however, there remain problems with stitches. Stitches refer to the dividing points between different masks on the same sub-pattern. Stitches can degrade reliability of integrated circuit fabrication processes and reduce the printability of the layout patterns.

Stitches can also cause pattern defects such as stitching displacement or pattern short-circuiting during the fabrication process, thereby reducing the reliability of integrated circuit layouts or circuit cells. Therefore, there is a need for a monitoring pattern for double patterning, as well as for a pattern stitch monitoring method and a semiconductor wafer therewith.

SUMMARY

One aspect of the present invention provides a monitoring pattern for pattern stitch in double patterning to check for pattern cut displacement in stitching areas and to increase reliability and printability of layouts. In one embodiment of the present invention, a monitoring pattern for pattern stitch in double patterning comprises a plurality of pattern cuts that include at least one line-ended cut and at least one non-line-ended cut, wherein every pattern cut has a stitching critical dimension (CD).

Another aspect of the present invention provides a method for monitoring pattern stitch with a monitoring pattern in double patterning to check for pattern cut displacement in stitching areas and to increase reliability and printability of layouts. In one embodiment of the present invention, a method for monitoring pattern stitch with a monitoring pattern in double patterning comprises the steps of: locating a monitoring pattern in at least one area of a semiconductor wafer, wherein the at least one area of the semiconductor wafer has a target pattern corresponding to the monitoring pattern, the monitoring pattern comprises a plurality of pattern cuts that include at least one line-ended cut and at least one non-line-ended cut, and every pattern cut has a stitching critical dimension (CD); comparing corresponding stitching critical dimensions of the target pattern and the monitoring pattern; and determining a measure for adjusting the pattern stitch of the target pattern according to the comparison results.

Another aspect of the present invention provides a semiconductor wafer. In one embodiment of the present invention, the semiconductor wafer comprises at least one target pattern corresponding to a monitoring pattern for pattern stitch in double patterning, wherein the monitoring pattern comprises a plurality of pattern cuts that include at least one line-ended cut and at least one non-line-ended cut, wherein every pattern cut has a stitching critical dimension (CD).

The foregoing has outlined rather broadly the features of the present invention in order that the detailed description of the invention to follow may be better understood. Additional features of the invention will be described hereinafter and form the subject of the claims of the invention. It should be appreciated by those skilled in the art that the concept and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The objectives of the present invention will become apparent upon reading the following description and upon reference to the accompanying drawings in which.

DETAILED DESCRIPTION

Figure 1:
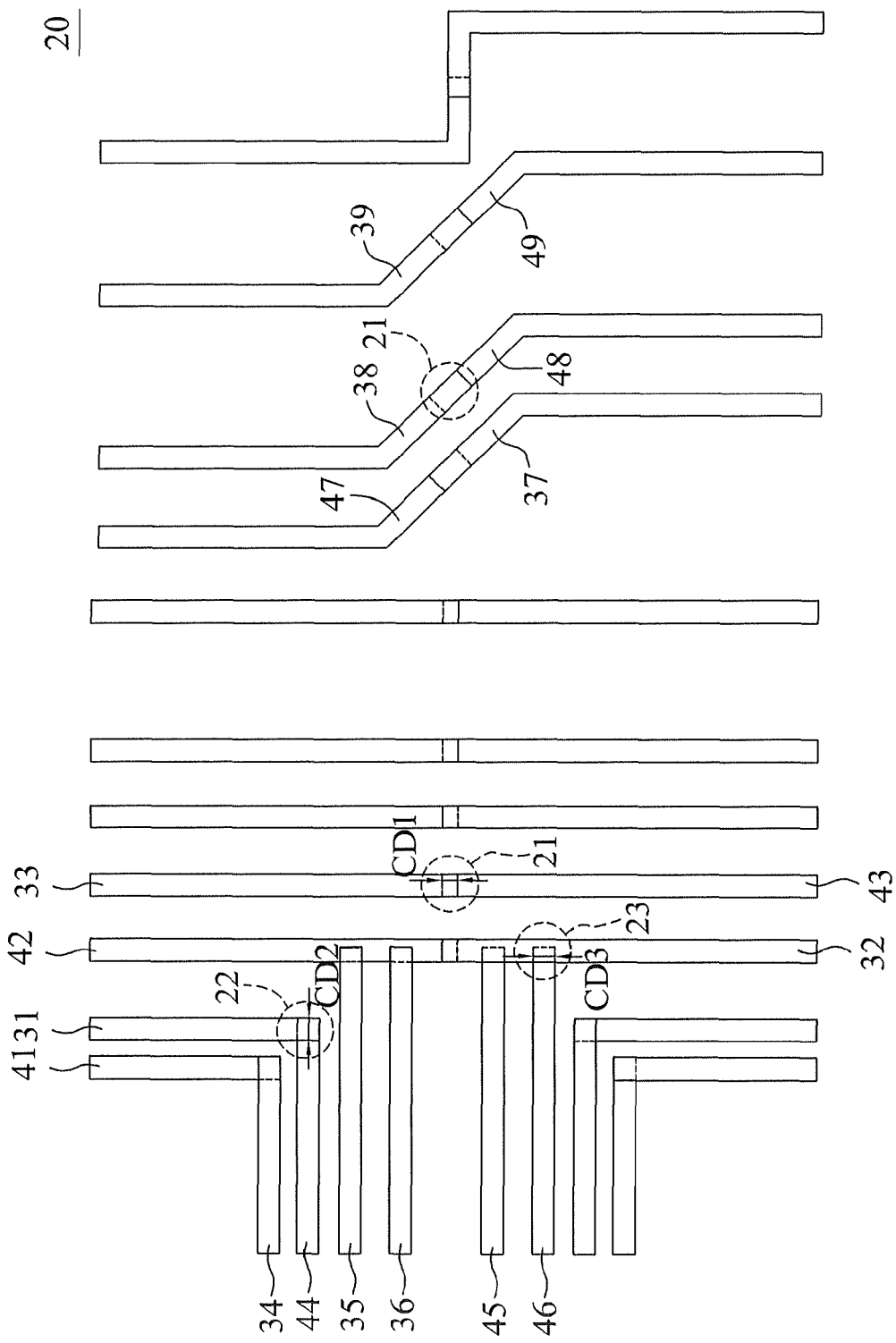
FIG. 1 illustrates a monitoring pattern according to one embodiment of the present invention.
Figure 2:
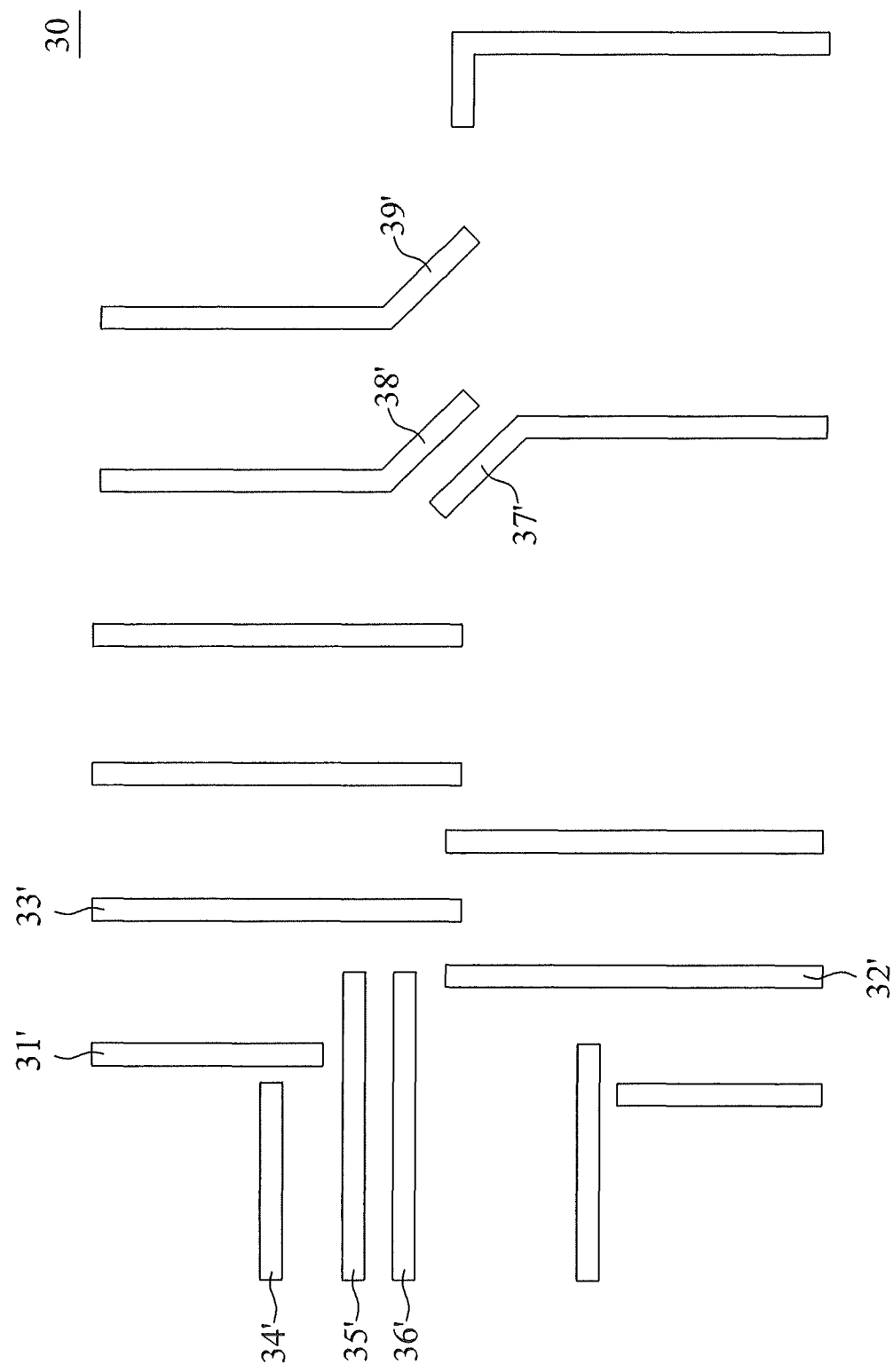
FIGS. 2 and 3 illustrate a first photomask and a second photomask for configuring a pattern corresponding to the monitoring pattern according to one embodiment of the present invention.
Figure 3:
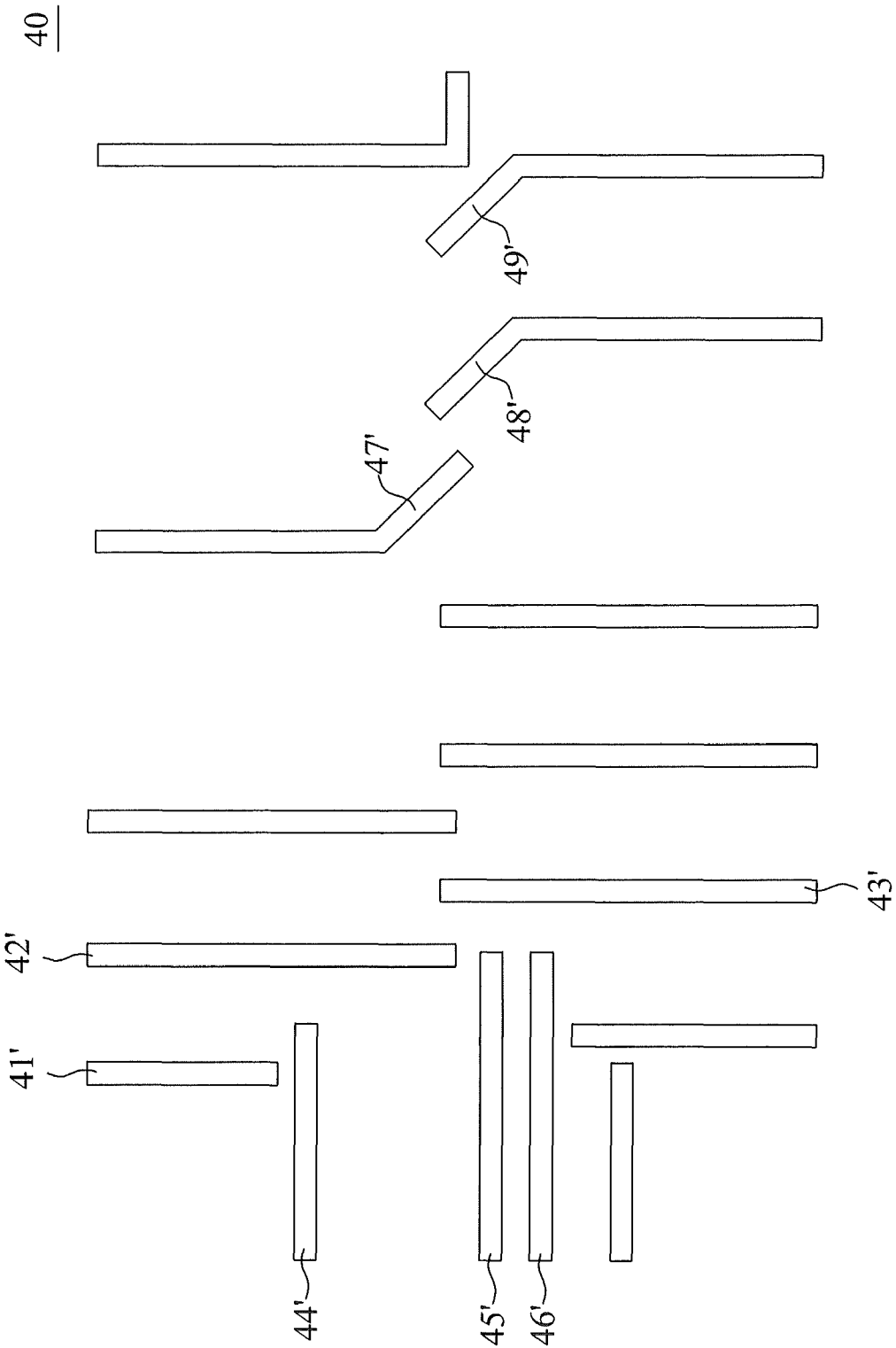

FIG. 1 illustrates a monitoring pattern 20 according to one embodiment of the present invention. FIGS. 2 and 3 illustrate a first photomask 20 and a second photomask 30 for configuring a pattern corresponding to the monitoring pattern 20 according to one embodiment of the present invention. The first photomask 30 and the second photomask 40 each include one half of the monitoring pattern 20. In this embodiment, the first photomask 30 includes a plurality of vertical lines 31', 32', 33', a plurality of horizontal lines 34', 35', 36' and a plurality of diagonal lines 37', 38', 39', and the second photomask 40 includes a plurality of vertical lines 41', 42', 43', a plurality of horizontal lines 44', 45', 46' and a plurality of diagonal lines 47', 48', 49'.

The monitoring pattern 20 corresponds to a pattern which is configured by the first photomask 30 and the second photomask 40 overlaying each other. In this embodiment, the first photomask 30 is disposed above the second photomask 40. Alternatively, the first photomask 30 may be disposed under the second photomask 40.

In the monitoring pattern 20, vertical lines such as 31 to 33 and 41 to 43, horizontal lines such as 34 to 36 and 44 to 46, and diagonal lines such as 37 to 39 and 47 to 49 correspond to the vertical lines 31' to 33' and 41' to 43', horizontal lines 34' to 36' and 44' to 46', and diagonal lines 37' to 39' and 47' to 49', respectively.

Referring to FIGS. 1 to 3, in one embodiment of the present invention, a monitoring pattern 20 for pattern stitch in double patterning can comprise a plurality of pattern cuts that include at least one line-ended cut and at least one non-line-ended cut, wherein every pattern cut has a stitching critical dimension (CD). The line-ended cut may be a vertically line-ended cut, horizontally line-ended cut or diagonally line-ended cut, and the at least one non-line-ended cut may include at least one corner cut, at least one T-shaped cut, or a combination thereof. Preferably, the pattern cuts include at least one line-ended cut, at least one corner cut and at least one T-shaped cut.

In this embodiment, the monitoring pattern 20 comprises pattern cuts including a plurality of line-ended cuts 21 configured by the vertical lines 33 and 43, for example, a plurality of corner cuts 22 configured by the vertical line 31 and the horizontal line 44, for example, and a plurality of T-shaped cuts 23 configured by the vertical line 32 and the horizontal line 46, for example. It should be noted that the overlay areas configured by the diagonal lines 37, 38, 39 and 47, 48, 49, respectively, can be considered as line-ended cuts 21. In FIG. 1, the stitching critical dimensions of a line-ended cut 21, a corner cut 22 and a T-shaped cut 23 are referred to as CD1, CD2 and CD3, respectively.

A line-ended cut 21 always involves high overlay sensitivity, and a non-line-ended cut such as a corner cut 22 or a T-shaped cut 23 involves relatively low overlay sensitivity. Therefore, an area that includes at least one line-ended cut is a key point of inspection of the pattern cut displacement in stitching areas in double patterning.

Figure 4:
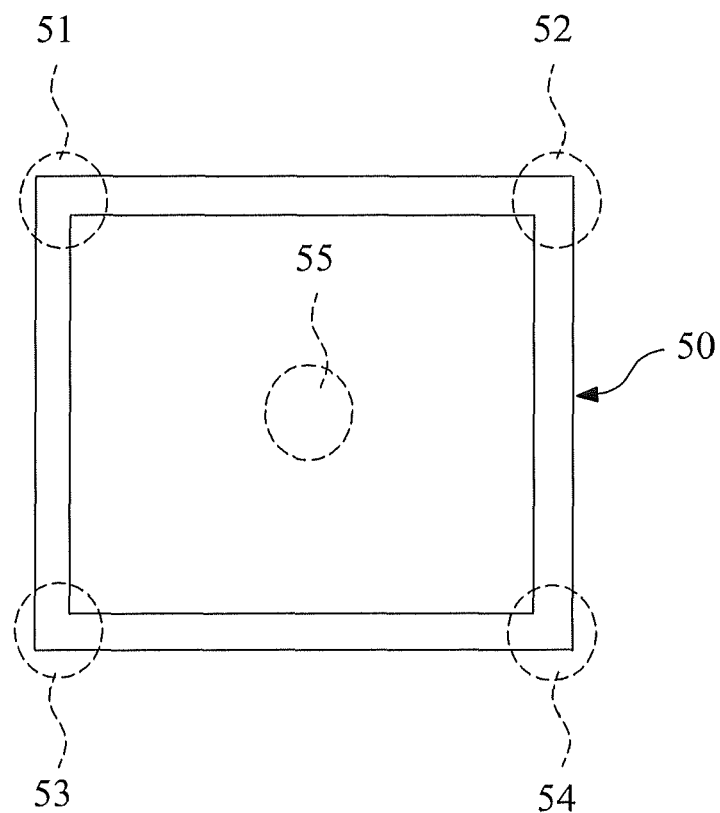
FIG. 4 illustrates a semiconductor wafer according to one embodiment of the present invention.

FIG. 4 illustrates a semiconductor wafer 50 according to one embodiment of the present invention. In one embodiment of the present invention, the monitoring pattern 20 is mapped to a semiconductor wafer 50 in double patterning, so that the semiconductor wafer 50 comprises at least one target pattern 60 corresponding to the monitoring pattern 20 for pattern stitch in double patterning. The target pattern 60 comprises a plurality of pattern cuts that include at least one line-ended cut and at least one non-line-ended cut, wherein every pattern cut has a stitching critical dimension (CD).

Figure 5:
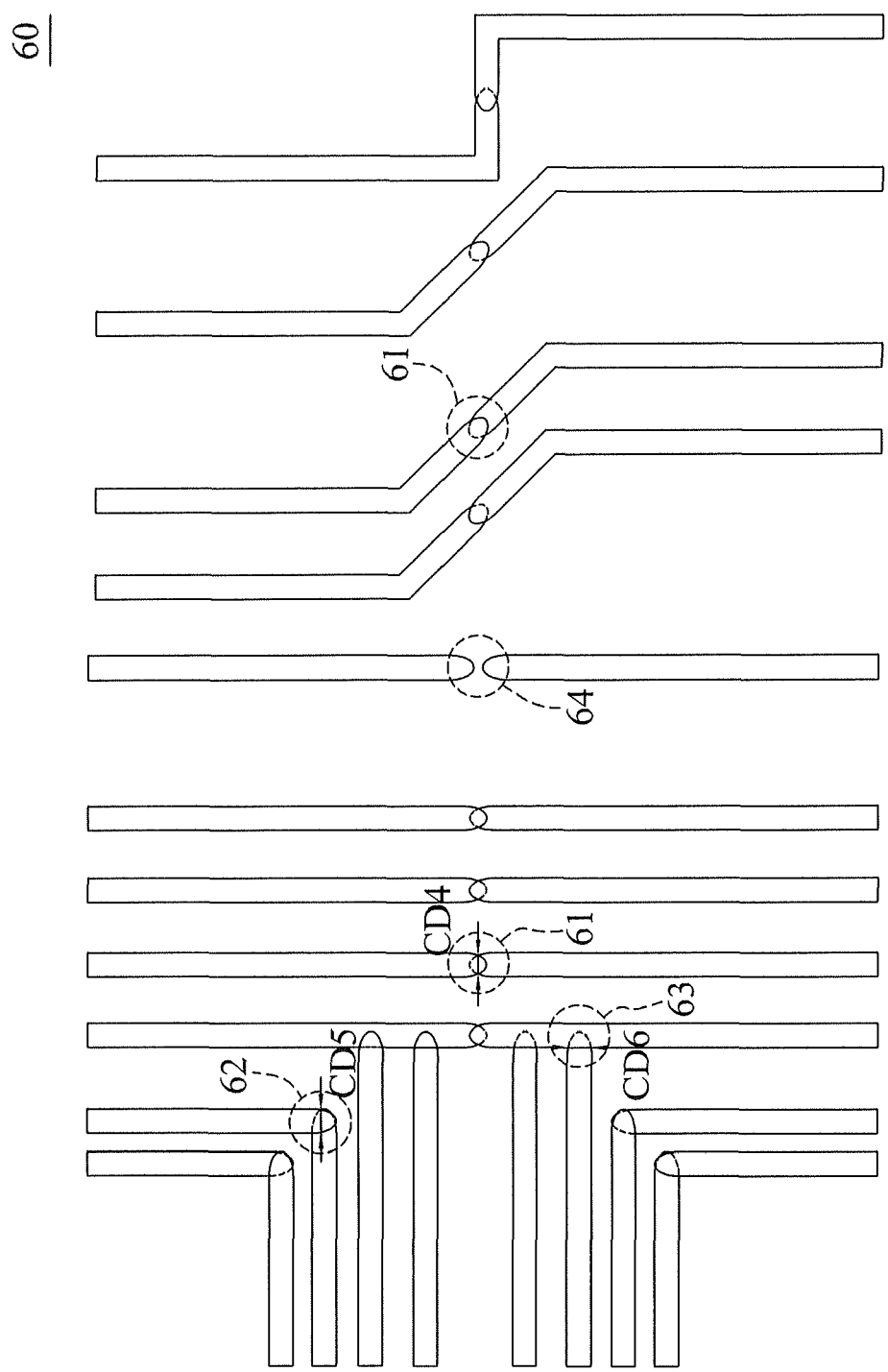
FIG. 5 illustrates a target pattern of a semiconductor wafer according to one embodiment of the present invention.

FIG. 5 illustrates a target pattern 60 of the semiconductor wafer 50 according to one embodiment of the present invention. In this embodiment, the semiconductor wafer 50 comprises target patterns 60 at four corner portions 51, 52, 53, 54 and the central portion 55 of the semiconductor wafer 50. The target pattern 60 comprises the pattern cuts including a plurality of line-ended cuts 61, a plurality of corner cuts 62, and a plurality of T-shaped cuts 63. In FIG. 5, the stitching critical dimensions of a line-ended cut 61, a corner cut 62 and a T-shaped cut 63 are referred to as CD4, CD5 and CD6, respectively. In practice, the stitching critical dimensions CD4, CD5 and CD6 of the pattern cuts of the target pattern 60 can be measured by scanning electron microscope (SEM), for example.

Figure 6:
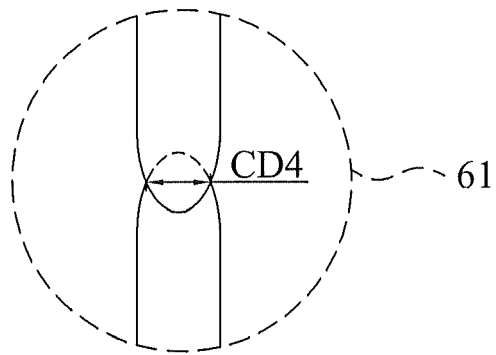
FIGS. 6 to 8 show close-up views of selected portions in FIG. 5.
Figure 7:
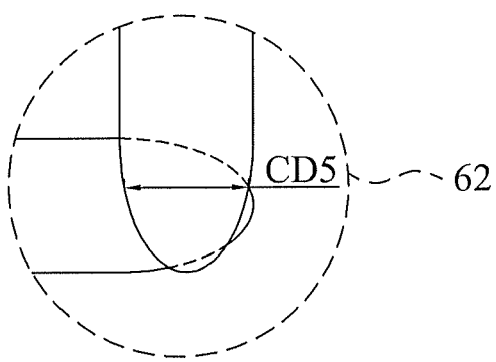
Figure 8:
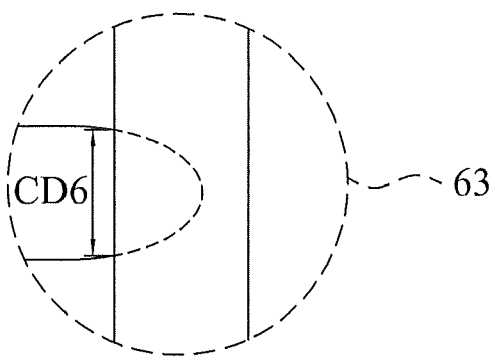

Theoretically, since the target pattern 60 is formed according to the monitoring pattern 20, the target pattern 60 of the semiconductor wafer 50 should be the same as the monitoring pattern 20 while the stitching critical dimensions CD4, CD5 and CD6 of the pattern cuts of the target pattern 60 are the same as CD1, CD2 and CD3 of the monitoring pattern 20. However, a nonalignment or a displacement between the first photomask 30 and the second photomask 40, for example, may cause narrow stitching critical dimensions CD4, CD5 and CD6 in stitching areas of the target pattern 60 (as shown in FIGS. 6 to 8, which can serve as close-up views of selected portions 61, 62 and 63 in FIG. 5) or non-connections of the pattern cuts 64 as shown in FIG. 5, thereby reducing reliability of the semiconductor wafer 50 including the target pattern 60.

To improve reliability of the semiconductor wafer 50 including the target pattern 60, a method for monitoring pattern stitch with a monitoring pattern in double patterning is provided, which checks for pattern cut displacement in stitching areas and increases reliability and printability of layouts.

Figure 9:
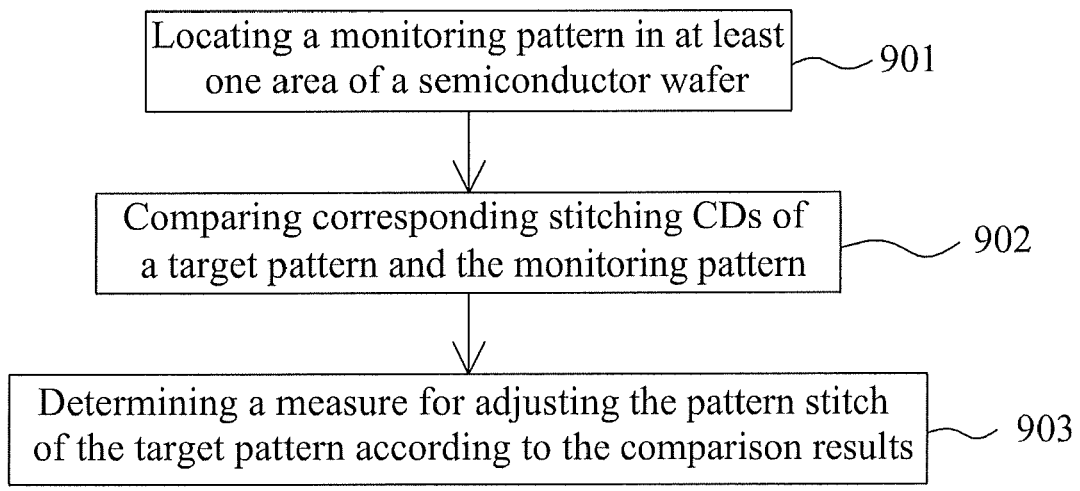
FIG. 9 is a flow diagram illustrating a method for monitoring pattern stitch with a monitoring pattern in double patterning according to one embodiment of the present invention.

FIG. 9 is a flow diagram illustrating a method for monitoring pattern stitch with a monitoring pattern 20 in double patterning according to one embodiment of the present invention. A monitoring pattern 20 is located in at least one area of the semiconductor wafer 50, wherein the at least one area of the semiconductor wafer 50 has a target pattern 60 corresponding to the monitoring pattern 20.

Referring to step 901, FIG. 1 and FIGS. 4 to 5, the monitoring pattern 20 can be (but is not limited to being) located correspondingly at four corner portions 51, 52, 53, 54 and the central portion 55 of the semiconductor wafer 50, and the pattern cuts of the monitoring pattern 20 correspond to scribe lines (not shown) of the semiconductor wafer 50.

Referring to step 902, stitching critical dimensions CD4, CD5 and CD6 of the target pattern 60 and stitching critical dimensions CD1, CD2 and CD3 of the monitoring pattern 20 at the corresponding stitching areas are compared, so as to check for pattern cut defects such as nonalignment or displacement of the semiconductor wafer 50.

Referring to step 903, a measure for adjusting the pattern stitch of the target pattern 60 is determined according to the comparison results. In one embodiment of the present invention, an overlay adjustment of the two photomasks, such as the first photomask 30 and the second photomask 40, is performed if a critical dimension of the target pattern 60 is smaller than that of the monitoring pattern 20 and if the smaller critical dimension of the target pattern 60 is caused by the overlay displacement of the two photomasks; alternatively, an enhancement of stitching length is performed to enhance the pattern cut of the semiconductor wafer 50 if a critical dimension of the target pattern 60 is smaller than that of the monitoring pattern 20 and if the smaller critical dimension of the target pattern 60 is caused by pattern stitching tolerance.

Therefore, pattern cut defects such as nonalignment or displacement of the semiconductor wafer 50 are inspected and corrected, and reliability and printability of layouts are increased.

Although the present invention and its objectives have been described in detail, it should be understood that various changes, substitutions and alterations can be made herein without departing from the spirit and scope of the invention as defined by the appended claims. For example, many of the processes discussed above can be implemented using different methodologies, replaced by other processes, or a combination thereof.

Moreover, the scope of the present application is not intended to be limited to the particular embodiments of the process, machine, manufacture, composition of matter, means, methods and steps described in the to specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A monitoring pattern for pattern stitch in double patterning, comprising a plurality of pattern cuts, wherein the pattern cuts include at least one line-ended cut, at least one corner cut, and at least one T-shaped cut, and every pattern cut has a stitching critical dimension.

2. The monitoring pattern for pattern stitch in double patterning of claim 1, wherein the line-ended cut is a vertically line-ended cut, horizontally line-ended cut or diagonally line-ended cut.

3. A semiconductor wafer, comprising at least one target pattern corresponding to a monitoring pattern for pattern stitch in double patterning, wherein the monitoring pattern comprises a plurality of pattern cuts, wherein the pattern cuts include at least one line-ended cut, at least one corner cut and at least on T-shaped cut, and every pattern cut has a stitching critical dimension (CD).

4. The semiconductor wafer of claim 3, wherein the line-ended cut is a vertically line-ended cut, horizontally line-ended cut or diagonally line-ended cut.

5. The semiconductor wafer of claim 3, wherein the target pattern corresponding to the monitoring pattern is located at four corner portions and the central portion of the semiconductor wafer, and the pattern cuts of the monitoring pattern correspond to scribe lines of the semiconductor wafer.

6. A method for monitoring pattern stitch with a monitoring pattern in double patterning, comprising the steps of:
locating a monitoring pattern in at least one area of a semiconductor wafer, wherein the at least one area of the semiconductor wafer has a target pattern corresponding to the monitoring pattern, the monitoring pattern comprises a plurality of pattern cuts that include at least one line-ended cut and at least one non-line-ended cut, and every pattern cut has a stitching critical dimension;

comparing corresponding stitching critical dimensions of the target pattern and the monitoring pattern; and determining a measure for adjusting the pattern stitch of the target pattern according to the comparison results.

7. The method for monitoring pattern stitch with a monitoring pattern in double patterning of claim 6, wherein the line-ended cut is a vertically line-ended cut, horizontally line-ended cut or diagonally line-ended cut.

8. The method for monitoring pattern stitch with a monitoring pattern in double patterning of claim 6, wherein the at least one non-line-ended cut includes at least one corner cut, at least one T-shaped cut, or a combination thereof.

9. The method for monitoring pattern stitch with a monitoring pattern in double patterning of claim 6, wherein the pattern cuts include at least one line-ended cut, at least one corner cut and at least one T-shaped cut.

10. The method for monitoring pattern stitch with a monitoring pattern in double patterning of claim 6, wherein the monitoring pattern is located correspondingly at four corner portions and the central portion of the semiconductor wafer, and the pattern cuts of the monitoring pattern correspond to scribe lines of the semiconductor wafer.

11. The method for monitoring pattern stitch with a monitoring pattern in double patterning of claim 6, wherein the monitoring pattern corresponds to a pattern which is configured by two photomasks overlaying each other.

12. The method for monitoring pattern stitch with a monitoring pattern in double patterning of claim 11, wherein an overlay adjustment of the two photomasks is performed if a critical dimension of the target pattern is smaller than that of the monitoring pattern and if the smaller critical dimension of the target pattern is caused by the overlay displacement of the two photomasks.

13. The method for monitoring pattern stitch with a monitoring pattern in double patterning of claim 5, wherein an enhancement of stitching length is performed if a critical dimension of the target pattern is smaller than that of the monitoring pattern and if the smaller critical dimension of the target pattern is caused by pattern stitching tolerance.

* * * * *